(12) United States Patent
Yoneyama et al.

(10) Patent No.: US 7,613,429 B2
(45) Date of Patent: Nov. 3, 2009

(54) NRD GUIDE TRANSCEIVER, DOWNLOAD SYSTEM USING THE SAME, AND DOWNLOAD MEMORY USED FOR THE SAME

(75) Inventors: Tsukasa Yoneyama, Sendai (JP); Hirokazu Sawada, Sendai (JP)

(73) Assignee: Intelligent Cosmos Research Institute, Sendai-Shi (JP)

( * ) Notice: Subject to any disclaimer, the term of this patent is extended or adjusted under 35 U.S.C. 154(b) by 644 days.

(21) Appl. No.: 10/576,127

(22) PCT Filed: Oct. 15, 2004

(86) PCT No.: PCT/JP2004/015254

§ 371 (c)(1),
(2), (4) Date: Apr. 14, 2006

(87) PCT Pub. No.: WO2005/038975

PCT Pub. Date: Apr. 28, 2005

(65) Prior Publication Data

US 2007/0129021 A1 Jun. 7, 2007

(30) Foreign Application Priority Data

Oct. 15, 2003 (JP) .............................. 2003-355283
Mar. 4, 2004 (JP) .............................. 2004-061299

(51) Int. Cl.
*H04B 1/38* (2006.01)
(52) U.S. Cl. ............................. 455/73; 455/81; 455/280; 455/269
(58) Field of Classification Search .................... 455/81, 455/73, 280, 269
See application file for complete search history.

(56) References Cited

U.S. PATENT DOCUMENTS

| 4,463,330 | A | * | 7/1984 | Yoneyama | ................... | 333/239 |
| 5,469,128 | A | * | 11/1995 | Kawanishi et al. | ........ | 333/22 R |
| 5,666,094 | A | * | 9/1997 | Kato et al. | ................... | 333/248 |
| 5,861,782 | A | * | 1/1999 | Saitoh | ........................ | 333/239 |
| 5,970,401 | A | * | 10/1999 | Nishida et al. | .............. | 455/326 |
| 5,990,764 | A | * | 11/1999 | Tanizaki et al. | ............. | 333/202 |
| 6,011,983 | A | * | 1/2000 | Ishikawa et al. | ............ | 505/210 |
| 6,094,106 | A | * | 7/2000 | Kishino et al. | ............ | 333/22 R |
| 6,163,227 | A | * | 12/2000 | Saitoh et al. | ............ | 331/117 D |

(Continued)

FOREIGN PATENT DOCUMENTS

JP 5-236154 9/1993

(Continued)

*Primary Examiner*—Duc Nguyen
*Assistant Examiner*—Amar Daglawi
(74) *Attorney, Agent, or Firm*—Young & Thompson

(57) ABSTRACT

The invention aims at providing an NRD guide transceiver not requiring a change-over switch for transmission and reception, a download system being of a simple structure and capable of downloading large-capacity data such as video data and the like in a short time using this transceiver and a download memory used in this system, said NRD guide transceiver comprising a pair of dielectric strips (154, 155) disposed between a pair of conductor plates (152, 153) arranged in parallel with each other at a specified interval, wherein Schottky barrier diodes (156, 157) are connected to the respective ends of both of said pair of dielectric strips, a low pass filter (164) is connected to a signal input terminal and a high pass filter (165) is connected to an IF output terminal.

8 Claims, 11 Drawing Sheets

U.S. PATENT DOCUMENTS

| | | | | |
|---|---|---|---|---|
| 6,486,753 | B1 * | 11/2002 | Kim | 333/208 |
| 6,514,832 | B1 * | 2/2003 | Nakagawa et al. | 438/412 |
| 6,515,554 | B2 * | 2/2003 | Ishikawa et al. | 333/21 R |
| 6,518,932 | B1 * | 2/2003 | Matsui et al. | 343/770 |
| 6,585,566 | B2 * | 7/2003 | Takeda | 451/29 |
| 6,630,870 | B1 * | 10/2003 | Kii et al. | 331/96 |
| 6,832,081 | B1 * | 12/2004 | Hiramatsu et al. | 455/328 |
| 6,882,253 | B2 * | 4/2005 | Okamura et al. | 333/239 |
| 6,956,447 | B2 * | 10/2005 | Lee et al. | 333/113 |
| 7,068,118 | B2 * | 6/2006 | Kii et al. | 333/1 |
| 7,095,366 | B2 * | 8/2006 | Kato et al. | 342/175 |
| 2003/0035315 | A1 * | 2/2003 | Kozicki | 365/171 |
| 2005/0070232 | A1 * | 3/2005 | Mages | 455/78 |

FOREIGN PATENT DOCUMENTS

| | | |
|---|---|---|
| JP | 10-256903 | 9/1998 |
| JP | 2002-359506 | 12/2002 |
| JP | 2003-205169 | 7/2003 |

* cited by examiner

NRD GUIDE TRANSCEIVER, DOWNLOAD SYSTEM USING THE SAME, AND DOWNLOAD MEMORY USED FOR THE SAME

TECHNICAL FIELD

This invention relates to an NRD guide transceiver which is a key element for realizing an ultrahigh-speed and large-capacity wireless communication of an ultrahigh-speed radio LAN, a home link, a broadband radio access system, a vehicle-to-vehicle communication system and the like, a download system using this transceiver and a download memory used in this system.

BACKGROUND ART

In recent years, the implementation of an ultrahigh-speed and large-capacity wireless communication is intensely demanded and the development of a broadband circuit component covering a millimeter-wave band of 59 to 66 GHz not requiring license stipulated by the Radio Law has been important. By this, an ultrahigh-speed radio LAN, a home link, a broadband radio access system, a vehicle-to-vehicle communication system and the like can be realized at a transmission rate exceeding 1 Gbps for example.

And as a transmission line for such a millimeter wave of 60 GHz band, there is known an NRD guide composed by inserting a dielectric strip being square in section into a cut-off parallel plate waveguide (see patent literature 1, for example).

An NRD guide is composed by disposing a dielectric strip being square in section between a pair of conductor plates of about 4.0 mm in thickness being arranged above and below in parallel with each other at a specified interval. A good electrically conductive and non-magnetic material such as aluminum, copper, brass or the like is used as the conductor plate. And a dielectric substance being low in loss in a high-frequency band like a millimeter-wave band, said dielectric substance being 3.0 or less in dielectric constant $\in r$, such as Teflon (trademark) of $\in r=2.04$, polyethylene of $\in r=2.1$, polystyrene of $\in r=2.56$ or the like for example is used as a dielectric strip.

FIG. 20 is a configuration diagram in case of applying such an NRD guide to an NRD guide receiver in an NRD guide multi-channel television signal transmission system. A 60-GHz band millimeter wave received by a receiving antenna 102 of an NRD guide receiver 101 is divided into two through a 3 dB NRD guide coupler 107 composed of a pair of curved dielectric strips 105, 106 disposed between a pair of conductor plates 103, 104.

The radius of curvature r and the angle θ of the curved portion of the dielectric strip 105 are set as r=10 mm and θ=110 degrees. And the radius of curvature r of the curved portion of the dielectric strip 106 is set as r=43 mm. The dielectric strip 106 may be formed into the shape of a straight line. A 60-GHz band millimeter wave is divided into two by the NRD guide coupler 107 and thereafter introduced into balance mixers 108, 109.

The balance mixers 108, 109 have a structure performing mixing by means of two Schottky barrier diodes 110, 111 and being made high in sensitivity. And Teflon (trademark) chips 112, 113 attached to the front faces of mounts of the Schottky barrier diodes 110, 111 protect the Schottky barrier diodes 110, 111 from being broken. In similar manner, high-permittivity films (not illustrated) attached to the back faces of the mounts of the Schottky barrier diodes 110, 111 match the Schottky barrier diodes 110, 111 being low in resistance and the dielectric strips 105, 106 being high in impedance with each other. Further, Teflon (trademark) chips 114, 115 mounted on the back of the high-permittivity films make higher the matching with the NRD guide coupler 107.

An oscillation signal from a Gunn diode oscillator 116 having a Gunn diode mounted on a metal piece being H-shaped in section is led to the dielectric strip 106 through a metal strip resonator 117. And a mode suppressor 118 is inserted to an end portion of the dielectric strip 106 in order to suppress an undesired mode generated at the joint portion with the metal strip resonator 117. Further, a ceramic resonator 119 for stabilizing the frequency is disposed so as to side-couple near the dielectric strip 106. The ceramic resonator 119 is composed of a high-Q ceramic disk held by Teflon (trademark) disks from above and below between them, and the ceramic disk is placed in the middle of the conductor disks 103, 104 so as to remove emission. The ceramic disk is 0.47 mm in thickness and has a resonance frequency of 59 GHz.

A 59-GHz oscillation signal from the Gunn diode oscillator 116 is applied by the dielectric strip 106 through the NRD guide coupler 107 to the balance mixers 108, 109, is down-converted there and is outputted to a terminal 120 as an IF signal.

On the other hand, as an apparatus for performing downloading, recording, reproducing or the like of video data, up to now there have been a portable DVD player for reproducing video data recorded in a DVD, a solid player which has a storage portion, transfers and stores video data into this storage portion and reproduces this stored video data, a portable liquid crystal television for receiving and reproducing video data broadcasted, a notebook-sized personal computer capable of storing and reproducing video data in a large-capacity memory such as a hard disk or the like, and the like.

Patent literature 1: Japanese Patent Laid-Open Publication No. 2000-59,114

Patent literature 2: Japanese Patent Laid-Open Publication No.2002-092,571

DISCLOSURE OF THE INVENTION

Problems the Invention Attempts to Solve

By the way, an NRD guide transceiver needs an NRD guide transmitter being separate from an NRD guide receiver 101 composed as described above.

On the contrary, a publicly known communication circuit uses a common antenna as a transmitting and receiving antenna by means of a change-over switch. For example, a transceiver 121 shown in FIG. 21 is provided with a transmitting circuit 126 and a receiving circuit 127 which are changed over by change-over switches 124 and 125 between an oscillator 122 and a transmitting and receiving antenna 123.

In this case, it is possible to make a power amplifier 128 and a low-noise amplifier 129 shown in FIG. 21 unnecessary by utilizing the characteristic of low loss of an NRD guide. FIG. 22 shows a transceiver 131 not needing such amplifiers. This transceiver 131 also needs a change-over switch 134 for a transmission side and a reception side between an oscillator 132 and a transmitting and receiving antenna 133.

Further, as a result of making such amplifiers unnecessary, as shown in FIG. 23, it has become possible to realize a millimeter-wave transceiver of a simple structure utilizing an NRD guide coupler 141 (its detail is disclosed in Japanese Patent Application No. 2002-91,496). In FIG. 23, symbols 142, 143 are dielectric strips, 144 is a Gunn diode, 145 is a transmitter and 146 is a receiver.

Even in case of using such an NRD guide coupler 141, however, the transmitter 145 and the receiver 146 have needed to be changed over by a high-speed change-over switch 147.

On the other hand, a portable DVD player described above, which reproduces video data, has a problem that it has noises at the time of reproduction by means of such a DVD disk and the storage medium is large. And a solid player has a problem that it takes a long time to transfer video data to a storage portion, desired video cannot be immediately watched and video of a large capacity cannot be watched because of a small capacity of the storage portion. Further, a portable liquid crystal television has a problem that it cannot allow reproduced video data to be freely selected due to having no storage medium. Video data by a notebook-sized personal computer is fundamentally stored in a large-capacity hard disk and the like, and there is no problem in reproduction but in case of transferring desired video data to a notebook-sized personal computer side, since large-capacity video data are stored in a hard disk performing a mechanical operation, there has been a problem that a transmission rate is lowered and as a result the transmission takes a long time. In any case, there is a problem that conventional devices cannot download large-capacity video data in a short time.

This invention has been made in consideration of the above-mentioned problems and aims at providing an NRD guide transceiver needing no change-over switch for transmission and reception, a download system capable of downloading large-capacity data such as video data and the like in a short time by means of a simple configuration using this transceiver, and a download memory to be used in this system.

Means for Solving the Problems

In order to solve the above-mentioned problems and achieve the object, this invention is characterized by an NRD guide circuit comprising a pair of dielectric strips disposed between a pair of conductor plates arranged in parallel with each other at a specified interval, an oscillator connected to one end of one of said pair of dielectric strips, an antenna connected to one end of the other of said pair of dielectric strips and Schottky barrier diodes respectively connected to the other ends of both of said pair of dielectric strips, said NRD guide circuit being provided with a low pass filter connected to a signal input terminal and a high pass filter connected to an IF output terminal.

And this invention is characterized by an NRD guide circuit comprising a pair of dielectric strips disposed between a pair of conductor plates arranged in parallel with each other at a specified interval, an oscillator connected to one end of one of said pair of dielectric strips, an antenna connected to one end of the other of said pair of dielectric strips and Schottky barrier diodes respectively connected to the other ends of both of said pair of dielectric strips, said NRD guide circuit being provided with two low pass filters respectively connected to a signal input terminal and a circuit terminal and a high pass filter connected to an IF output terminal, wherein a resistor is connected to an output terminal of the filter connected to said circuit terminal.

And this invention is characterized in that the mount of said Schottoky barrier diodes is formed in one body in the above-mentioned invention.

And this invention is characterized in that a bias circuit for applying a bias voltage to said Schottky barrier diodes is juxtaposed in the above-mentioned invention.

And this invention is characterized in that it is a portable download memory being connected directly to a receiving means and having DRAM into which data received by said receiving means is directly written.

And this invention is characterized by further comprising a transmitting means for data transmission successively transmitting data stored in said download memory in the above-mentioned invention.

And this invention is characterized by comprising a server having a server side transmitting and receiving means capable of performing a large-capacity and high-speed data transmission, a server side memory having DRAM for storing large-capacity data in it and a transmission side control means for making said server side transmitting and receiving means transmit requested data out of data stored in said server side memory according to a request from a client side, and a client having a client side transmitting and receiving means for receiving data transmitted from said server side transmitting and receiving means, a download memory having DRAM into which large-capacity data received by said client side transmitting and receiving means are directly written and a reception side control means for indicating data to be downloaded to said server side and making the downloaded data be written into said download memory.

And this invention is characterized in that said server further comprises a non-volatile memory means for storing large-capacity data stored in said server side memory in it for backup in the above-mentioned invention.

And this invention is characterized in that said server side transmitting and receiving means and said client side transmitting and receiving means perform transmission and reception using a millimeter-wave transmission in the above-mentioned invention.

And this invention is characterized in that at least one of said server side transmitting and receiving means and said client side transmitting and receiving means is a circuit using an NRD guide in the above-mentioned invention.

And this invention is characterized by further comprising a reproducing apparatus being capable of having said download memory connected to it and reproducing data stored in said download memory.

And this invention is characterized in that said download memory comprises a radio-transmitting means for successively radio-transmitting data stored in said download memory, a radio-receiving means for receiving data transmitted from said radio-transmitting means and a reproducing apparatus for reproducing the received data in the above-mentioned invention.

And this invention is characterized by adding advertising data to said data to be downloaded in the above-mentioned invention.

And this invention is characterized in that said circuit using an NRD guide comprises a pair of dielectric strips disposed between a pair of conductor plates arranged in parallel with each other at a specified interval, an oscillator connected to one end of one of said pair of dielectric strips, an antenna connected to one end of the other of said pair of dielectric strips and Schottky barrier diodes respectively connected to the other ends of both of said pair of dielectric strips, a low pass filter connected to a signal input terminal and a high pass filter connected to an IF output terminal, in the above-mentioned invention.

And this invention is characterized in that said circuit using an NRD guide comprises a pair of dielectric strips disposed between a pair of conductor plates arranged in parallel with each other at a specified interval, an oscillator connected to one end of one of said pair of dielectric strips, an antenna connected to one end of the other of said pair of dielectric strips and Schottky barrier diodes respectively connected to the other ends of both of said pair of dielectric strips, two low pass filters respectively connected to a signal input terminal and a circuit terminal, and a high pass filter connected to an IF output terminal, wherein a resistor is connected to an output terminal of the filter connected to said circuit terminal, in the above-mentioned invention.

And this invention is characterized in that the mount of said Schottoky barrier diodes is formed in one body in the above-mentioned invention.

And this invention is characterized in that a bias circuit for applying a bias voltage to said Schottky barrier diodes is juxtaposed, in the above-mentioned invention.

Effect of the Invention

According to an NRD guide transceiver of this invention, it is possible to make an NRD guide transceiver enabling time-division transmission and reception requiring no change-over switch for transmission and reception between them in spite of being of a simple structure and inexpensive and further enabling mass-production of it.

And according to this invention, there is brought an effect of making it possible to perform a large-capacity transmission at a high speed since the server side memory and the download memory are formed out of DRAM and moreover the server side memory and the server side transmitting and receiving means are directly connected with each other and the download memory and the client side transmitting and receiving means are directly connected with each other.

DESCRIPTION OF THE SYMBOLS

151: NRD guide transceiver, 152: Conductor plate, 153: Conductor plate, 154: Dielectric strip, 155: Dielectric strip, 156: Schottky barrier diode, 157: Schottky barrier diode, 164: Low pass filter, 165: High pass filter, 169: Another low pass filter, 210: Server, 211, 221: Input/output portion, 212, 222: Control portion, 213: Large-capacity memory, 213*a*, 223*a*: DRAM, 214, 224: LAN card, 215, 225: Millimeter-wave transmitter-receiver, 216: HDD, 220: Client, 223, 240: Portable memory, 223*b*: Transmitter, 223*c*: Antenna, 230, 250: Reproducing apparatus, 250*a*: Display portion, 250*b*: Receiver, 250*c*: Transmitter

BEST MODE FOR CARRYING OUT THE INVENTION

Preferred embodiments of an NRD guide transceiver according to this invention, a download system using this transceiver and a download memory used in this system are described in detail with reference to the accompanying drawings in the following.

EMBODIMENT 1

Figure 1:
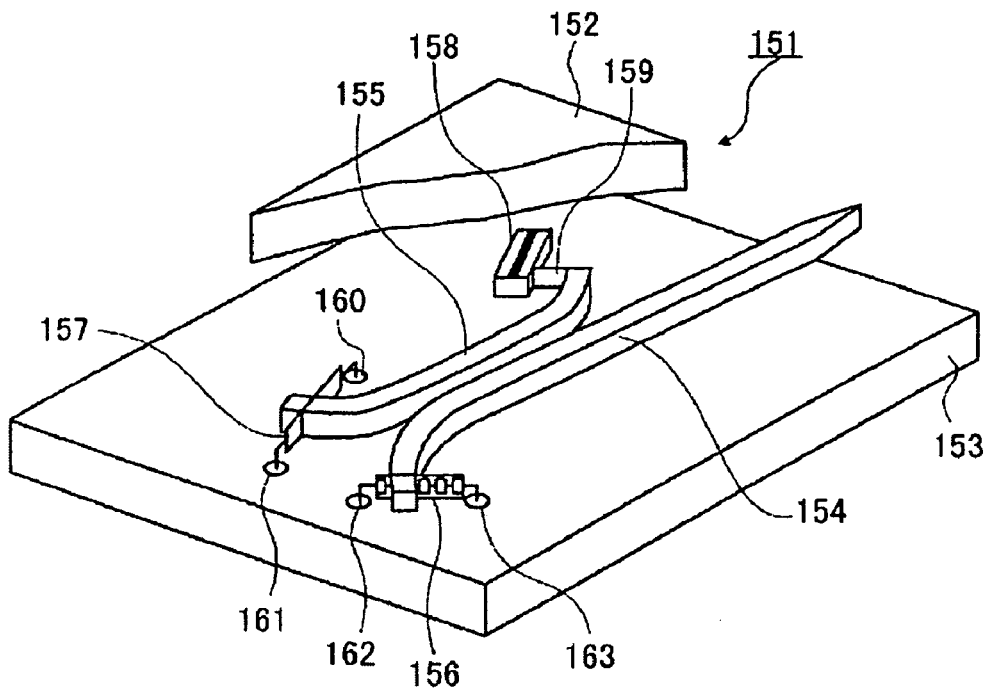
FIG. 1 is a perspective view of an NRD guide transceiver of the present invention.
Figure 2:
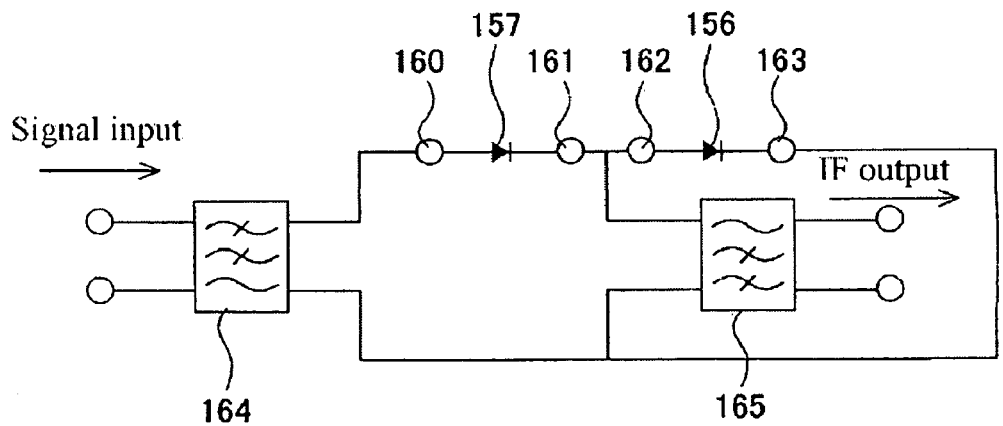
FIG. 2 is a circuit diagram of a main part of the NRD guide transceiver shown in FIG. 1.
Figure 6:
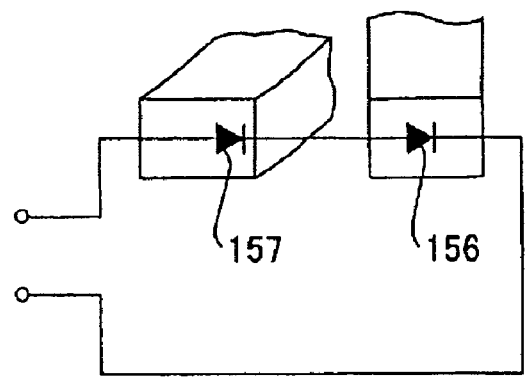
FIG. 6 is an explanatory diagram of a modulating circuit by means of an NRD guide transceiver of the present invention.
Figure 7:
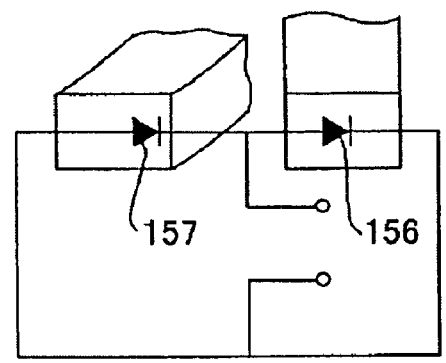
FIG. 7 is an explanatory diagram of a mixer circuit by means of an NRD guide transceiver of the present invention.

FIG. 1 shows embodiment 1 of an NRD guide transceiver according to this invention, FIG. 2 is a perspective view of an NRD guide transceiver, and FIGS. 6 and 7 are circuit diagrams of main parts. In FIG. 1, an NRD guide transceiver 151 is provided with a pair of curved dielectric strips 154, 155 disposed between a pair of conductor plates 152 and 153.

One end of the dielectric strip 154 is provided with a Schottky barrier diode 156. And the other end of the dielectric strip 154 is projected from the conductor plates 152, 153 in a tapering shape to form a transmitting and receiving antenna.

One end of the dielectric strip 155 is provided with a Schottky barrier diode 157. And the other end of the dielectric strip 155 is connected to a Gunn diode oscillator 158 having a metal piece being H-shaped in section and having a Gunn diode mounted on it through a metal strip resonator 159.

Both ends of the Schottky barrier diodes 156, 157 are respectively connected to contacts 160 to 163. The contacts 160 to 163 are electrically connected on the back face of the conductor plate 153. And as shown in FIG. 2, the back face of the conductor plate 153 is provided with a low pass filter 164 connected between the contact 160 and a signal input terminal, and a high pass filter 165 connected to between the contacts 161 and 162, and to an IF output terminal. And transmitted and received signals are separated in time division (time sharing) by these filters 164, 165.

Figure 4:
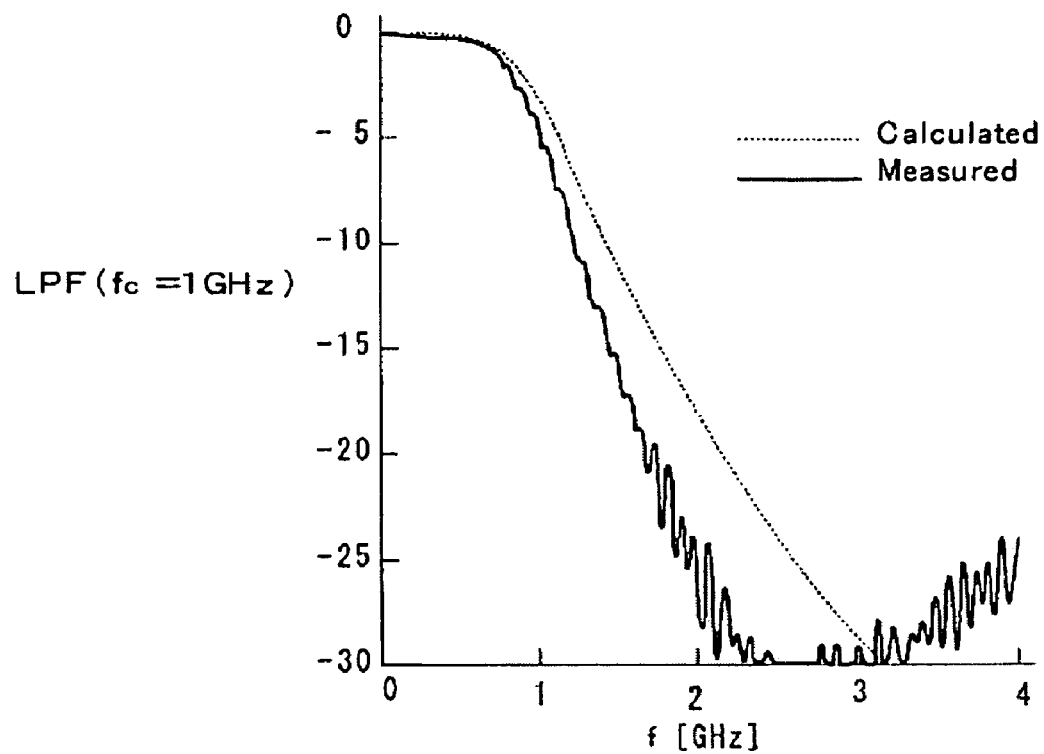
FIG. 4 is a graph showing a transmission characteristic of a low pass filter.
Figure 5:
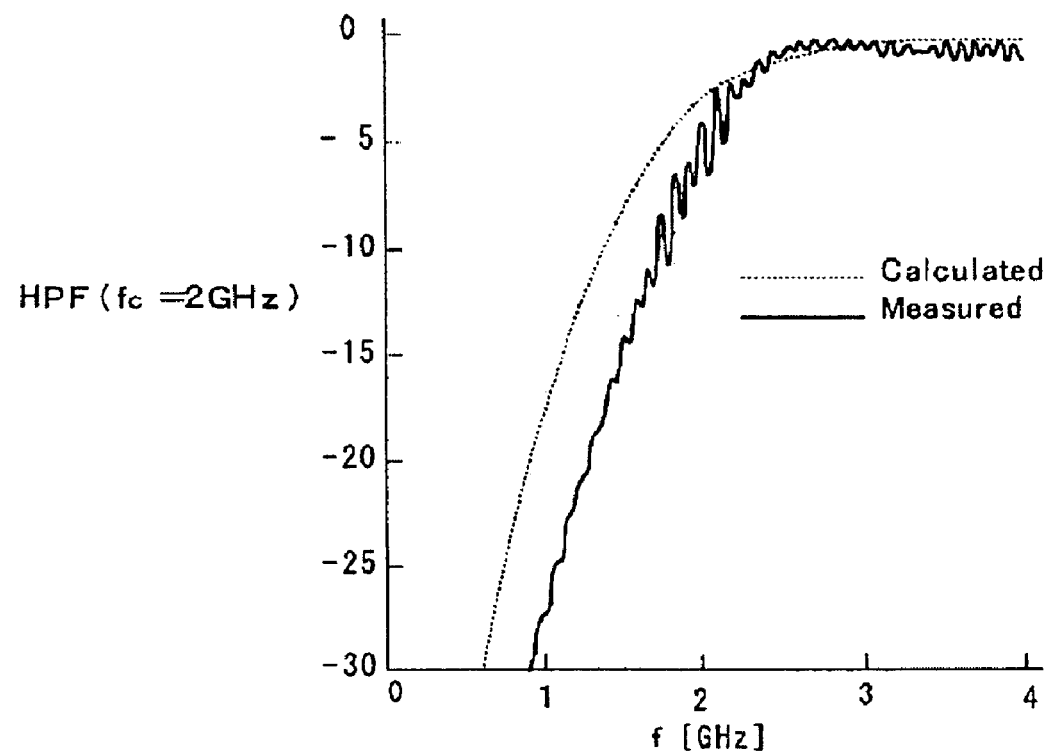
FIG. 5 is a graph showing a transmission characteristic of a high pass filter.
Figure 10:
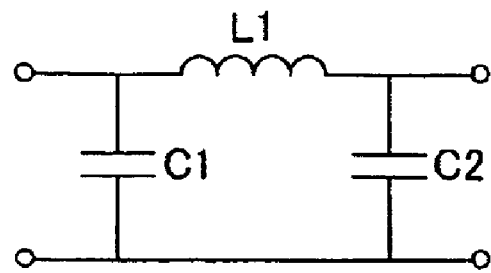
FIG. 10 is a circuit diagram of a low pass filter used in an NRD guide transceiver of the present invention.
Figure 11:
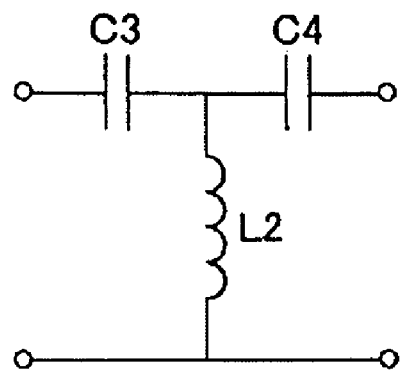
FIG. 11 is a circuit diagram of a high pass filter used in an NRD guide transceiver of the present invention.

Band pass characteristics of the filters 164 and 165 are respectively shown in graphs of FIGS. 4 and 5. FIG. 4 shows a transmission characteristic of the low pass filter 164 and FIG. 5 shows a transmission characteristic of the high pass filter 165. And the circuit configurations of the filters 164 and 165 are shown in FIGS. 10 and 11, respectively. FIG. 10 is a circuit diagram of the low pass filter 164 and FIG. 11 is a circuit diagram of the high pass filter. In FIG. 10, L1 is a coil, and C1, C2 are capacitors respectively connected to both ends of the coil L1. And in FIG. 11, C3, C4 are capacitors and L2 is a coil connected between the capacitors C3, C4.

Comparing an input signal frequency with an IF output frequency, the input signal frequency is lower than the IF output frequency. In this case, when cut-off frequencies of the filters 164 and 165 are set so as to be between these input and output frequencies, the following can be said:

That is to say, the high pass filter 165 is in an open state and becomes a modulator circuit at an operating frequency of the low pass filter 164, as shown in FIG. 6. On the other hand, the low pass filter 164 is in a short-circuited state and becomes a mixer circuit at an operating frequency of the high pass filter 165, as shown in FIG. 7. Due to this, it is possible to realize a transceiver not requiring a change-over switch for transmission and reception described in the prior art.

EMBODIMENT 2

Figure 14:
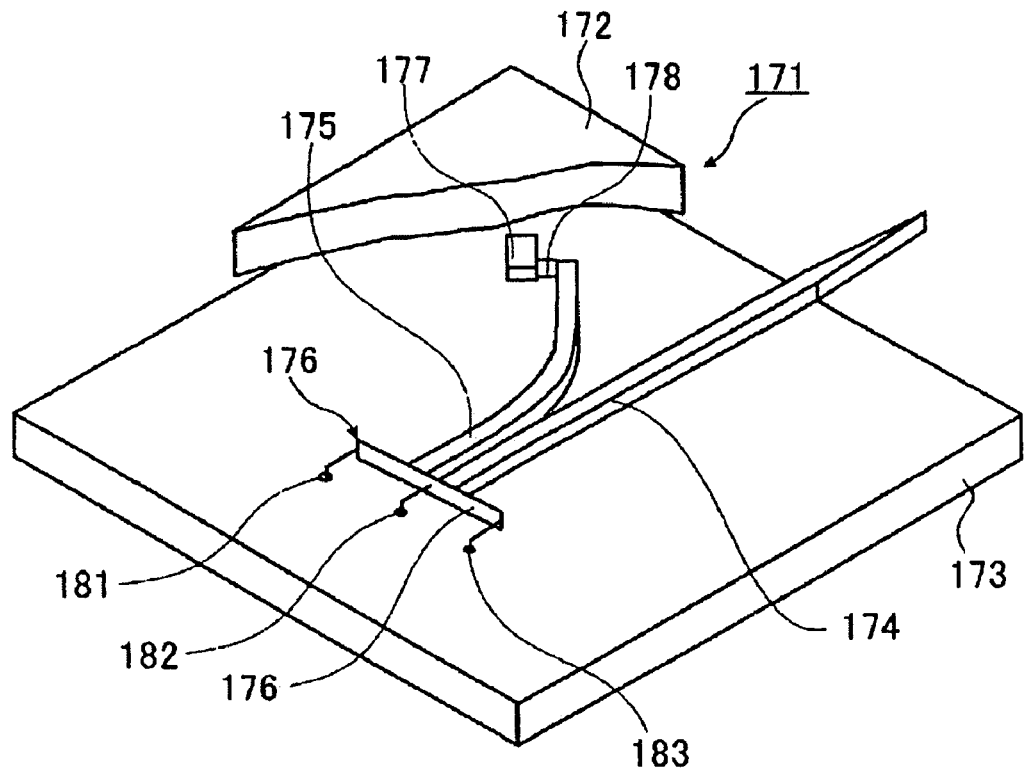
FIG. 14 is a perspective view of an NRD guide transceiver according to embodiment 2 of the present invention.
Figure 15:
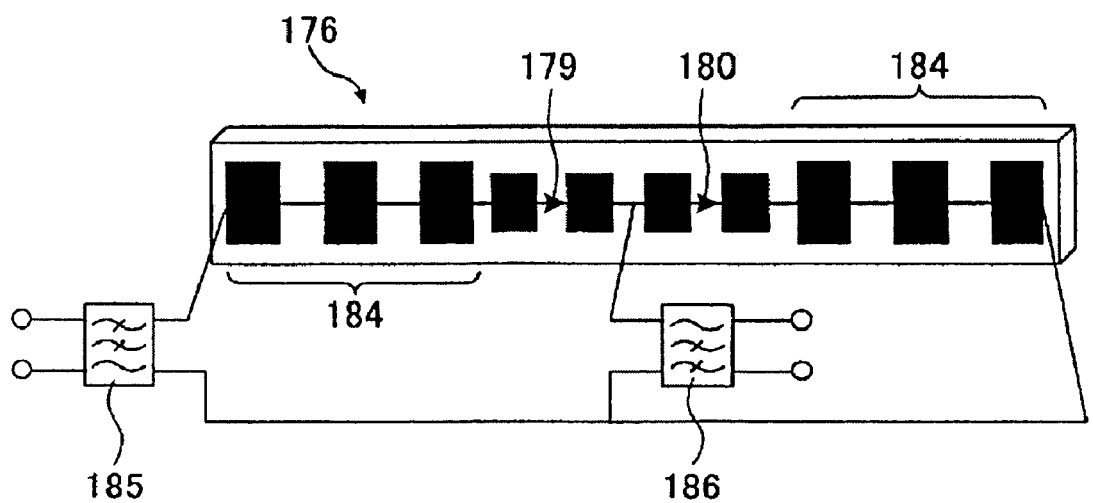
FIG. 15 is a circuit diagram of a main part of the NRD guide transceiver shown in FIG. 14.

FIGS. 14 and 15 show embodiment 2 of an NRD guide transceiver of the present invention, and FIG. 14 is a perspective view of an NRD guide transceiver and FIG. 15 is a block diagram of a main part of it. In FIGS. 14 and 15, an NRD guide transceiver 171 is provided with a pair of curved dielectric strips 174, 175 disposed between a pair of conductor plates 172 and 173.

One end of the dielectric strip 174 is provided with a mount 176 having a Schottky barrier diode connected to it. And the other end of the dielectric strip 174 is projected in a tapering shape from the conductor plates 172, 173 to form a transmitting and receiving antenna.

One end of the dielectric strip 175 is provided with the mount 176 having a Schottky barrier diode connected to it, said mount being common to the dielectric strip 174. And the other end of the dielectric strip 175 is connected to a Gunn diode oscillator 177 having a metal piece being nearly H-shaped in section and having a Gunn diode mounted on it through a metal strip resonator 178.

As shown in FIG. 15, the Schottky barrier diode mount 176 has a pair of Schottky barrier diodes 179, 180 connected to it, and both its ends and its center are connected with contacts 181 to 183. The contacts 181 to 183 are electrically connected on the back face of the conductor plate 173. The Schottky barrier diode mount 176 common to the dielectric strips 174, 175 is formed out of a choke pattern 184 printed on a Teflon (trademark) substrate.

And on the back face of the conductor plate 173, a low pass filter 185 is connected to a signal input terminal and a high pass filter 186 is connected to an IF output terminal, and transmitted and received signals are separated in time division by these filters 185 and 186.

Thus, in spite of a simple structure, this embodiment can improve its performance by forming the plate-shaped Schottky barrier diode mount 176 provided with the Schottky barrier diodes 179, 180 in one body so as to be common to the dielectric strips 174, 175.

EMBODIMENT 3

Figure 16:
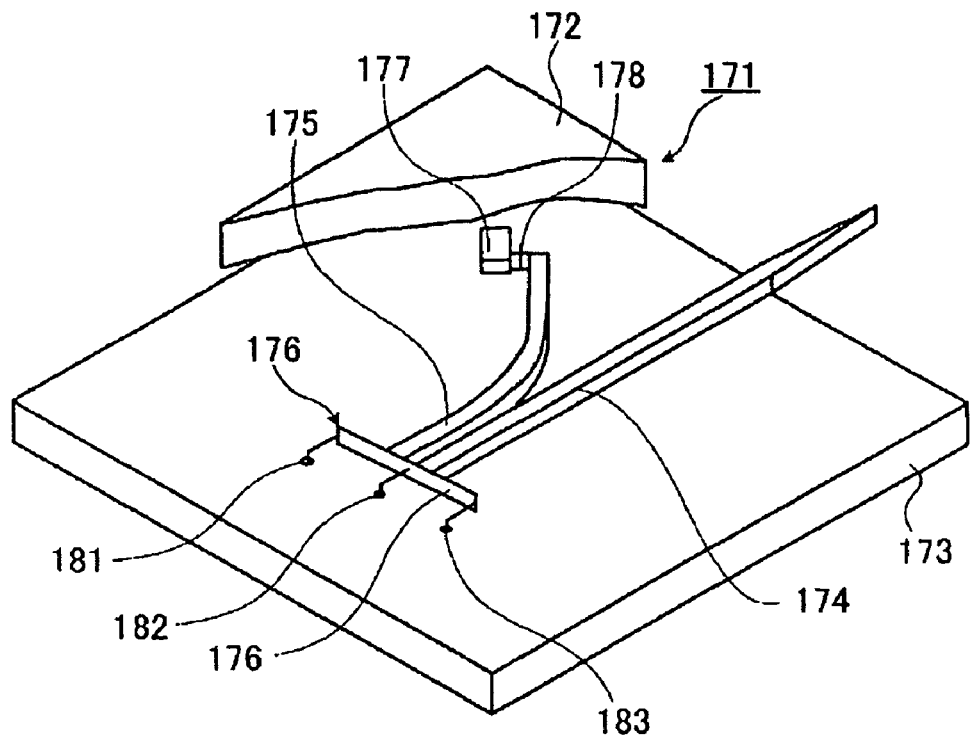
FIG. 16 is a perspective view of an NRD guide transceiver according to embodiment 3 of the present invention.
Figure 17:
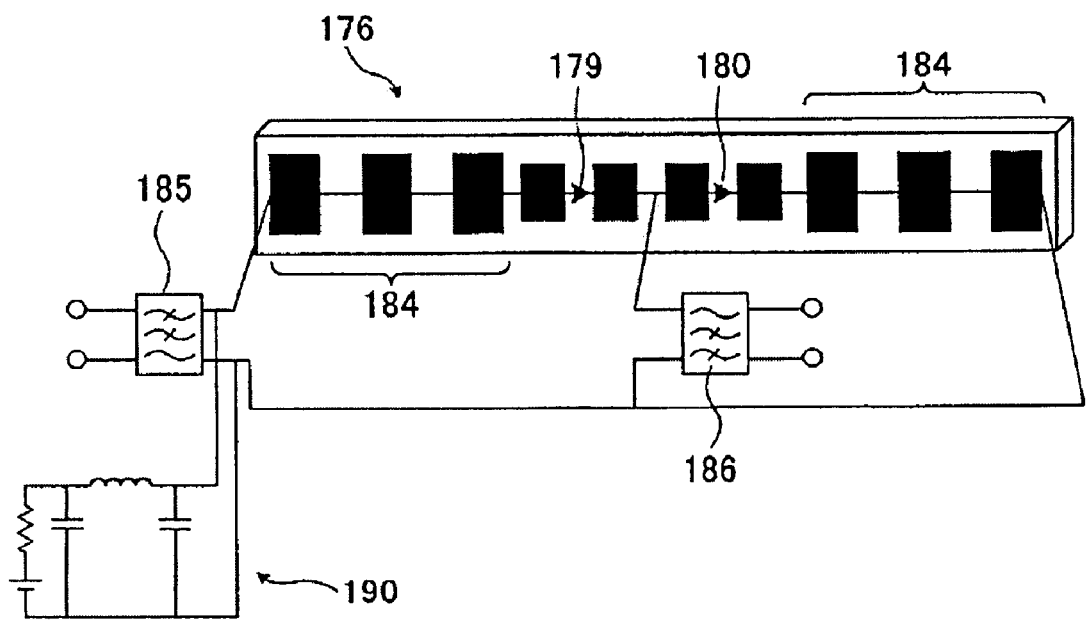
FIG. 17 is a circuit diagram of a main part of the NRD guide transceiver shown in FIG. 16.

As shown in FIGS. 16 and 17, a bias circuit 190 for applying a bias voltage may be connected according to need.

EMBODIMENT 4

Figure 3:
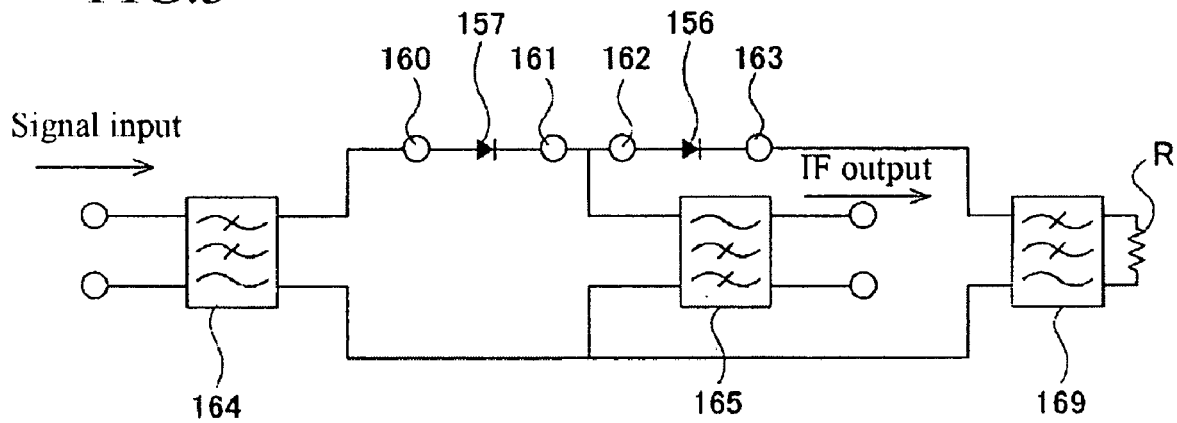
FIG. 3 is a circuit diagram of a main part of an NRD guide transceiver according to embodiment 4 of the present invention.
Figure 12:
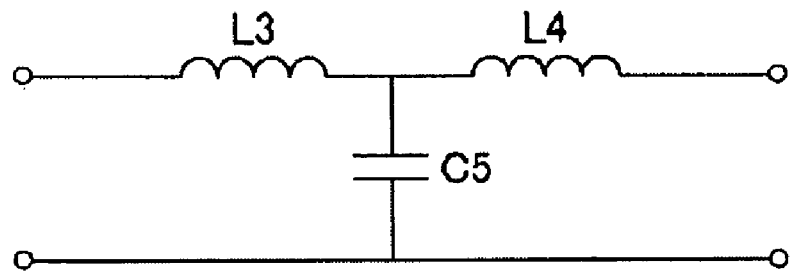
FIG. 12 is a circuit diagram of a low pass filter used in an NRD guide transceiver according to embodiment 4 of the present invention.

Embodiment 1 shown in FIG. 1 may have a circuit configuration shown in FIG. 3. In this case, the same filter 169 as a low pass filter connected to a signal input terminal is connected to a circuit terminal and terminated by a resistor R. Further, the low pass filter 169 used here is composed as shown in FIG. 12. That is, it is composed of a pair of coils L3, L4 and a capacitor C5 connected between these coils L3, L4.

Figure 8:
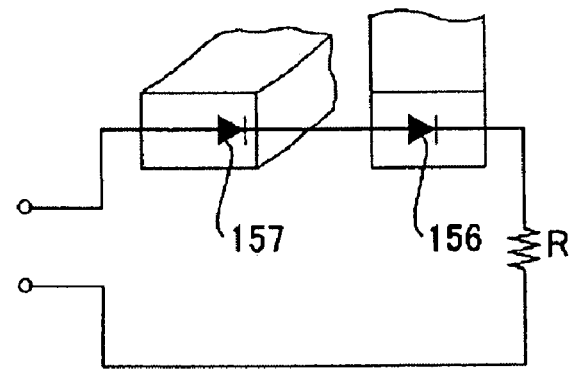
FIG. 8 is an explanatory diagram of a modulating circuit by means of an NRD guide transceiver according to embodiment 4 of the present invention.
Figure 9:
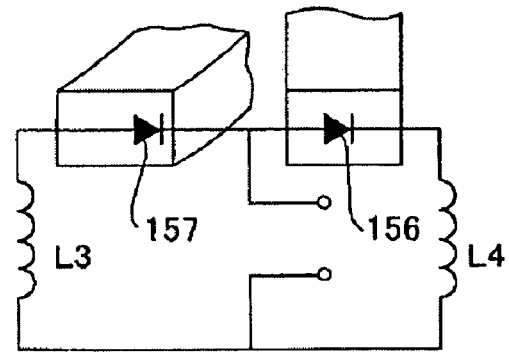
FIG. 9 is an explanatory diagram of a mixer circuit by means of an NRD guide transceiver according to embodiment 4 of the present invention.

According to such a configuration, in an IF frequency band a configuration shown in FIG. 3 is represented by an equivalent circuit shown in FIG. 9 and is improved in conversion loss as a mixer circuit. And an equivalent circuit in a signal frequency band is represented by FIG. 8 and can obtain the matching of a modulator by adjusting the value of a resistor R. That is, due to being provided with a resistor R, the number of spots for performing a matching operation is increased and it is possible also to make the matching better. The other points are the same as embodiment 1.

Figure 13:
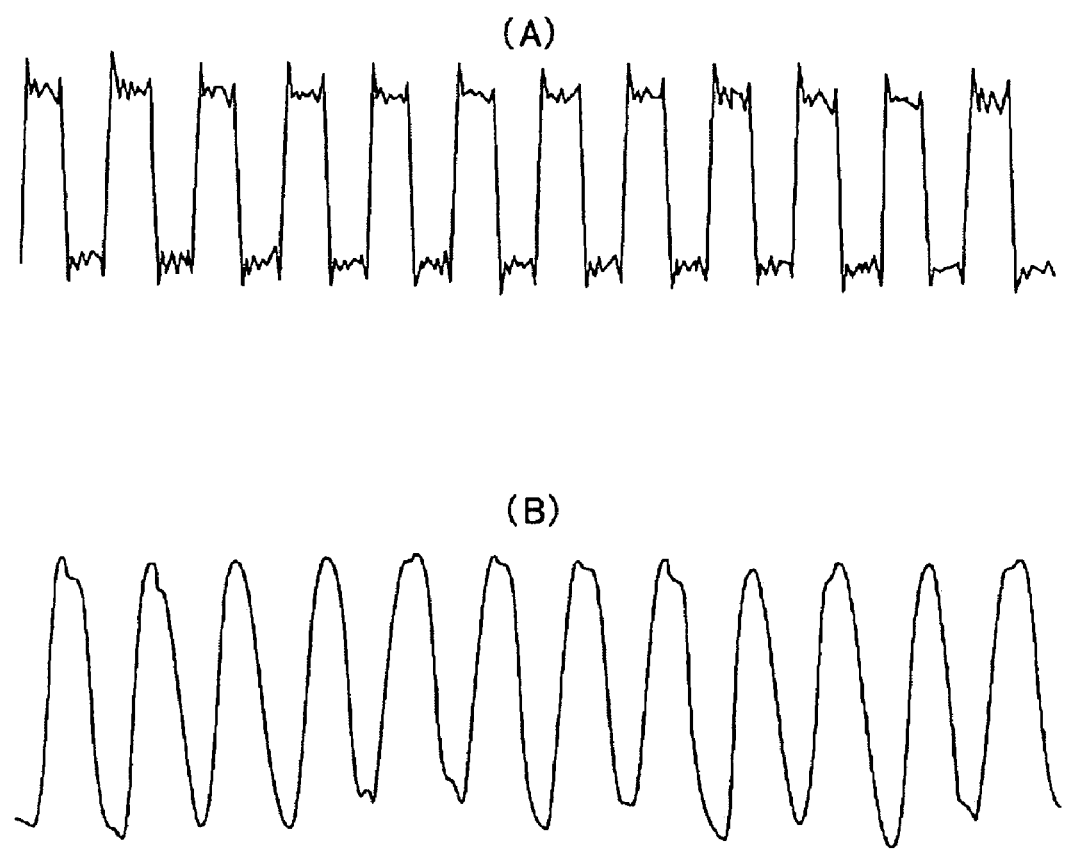
FIG. 13 is graphs showing a transmitted pulse and a received pulse showing a result of a transmission and reception experiment using an NRD guide transceiver of the present invention.

FIG. 13 is graphs of pulse signals in case of performing an ultrahigh-speed transmission experiment of 1.25 Gbps in transmission rate at a frequency of 60 GHz in an unbiased state, using such two NRD guide transceivers 51. As shown in FIG. 13, no lack of pulse has been found in a received pulse string of (B) in comparison with a transmitted pulse string of (A).

Although a high pass filter 165 is used in the above-mentioned embodiment, a conventional band pass filter may be used. Further, any antenna may be used as the antenna.

And in the above-mentioned embodiment, a structure in which an area where electromagnetic waves are coupled is localized may be used in order to making its transmission frequency band broader (see Japanese Patent Application No. 2003-115,706).

EMBODIMENT 5

Figure 18:
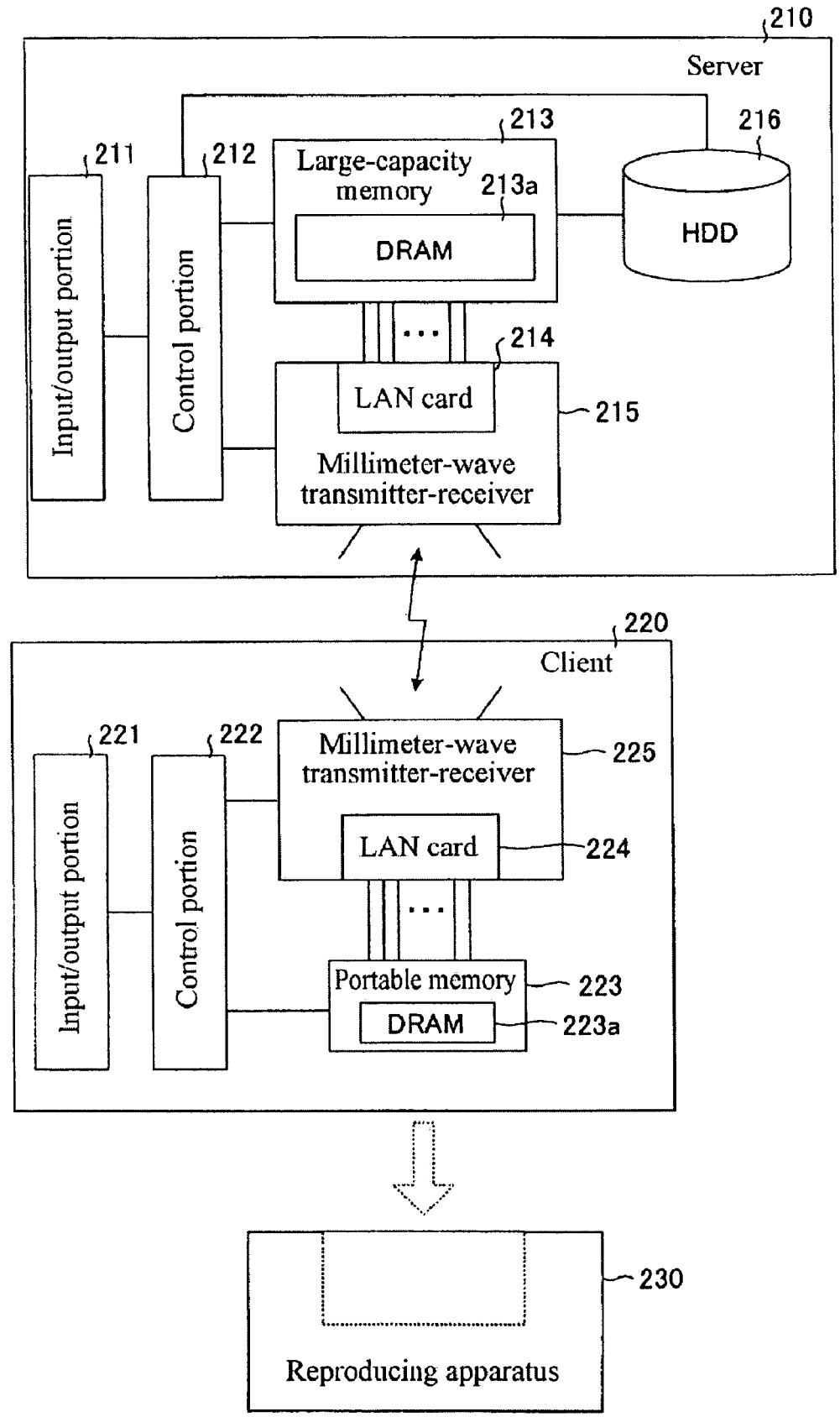
FIG. 18 is a diagram showing the configuration of a download system being embodiment 1 of this invention.

FIG. 18 is a block diagram showing the configuration of a download system being embodiment 5 of this invention. In FIG. 18, this download system has roughly a server 210 and a client 220. The server 210 has an input/output portion 211, a control portion 212, a large-capacity memory 213, a LAN card 214, a millimeter-wave transmitter-receiver 215 and an HDD (hard disk drive) 216. The large-capacity memory 213 has DRAM 213*a* of about 500 gigabytes capable of storing about 100 pieces of video data of about 2 hours for example. The LAN card 214 converts parallel to serial and sends video data from the large-capacity memory 213 to the millimeter-wave transmitter-receiver 215 side. The millimeter-wave transmitter-receiver 215 radio-transmits the serially converted video data as millimeter waves of 260 GHz band at a transmission rate of 1.5 Gbps and outputs received data to the control portion 212. The HDD 216 stores video data stored in the large-capacity memory 213 in it as backup data. It is enough that the storing into the HDD 216 is performed about one time a day. The input/output portion 211 performs input and output of various kinds of information, and inputs and stores new video data, if any, into the large-capacity memory 213. The control portion 212 controls the respective portions described above.

The client 220 has an input/output portion 221, a control portion 222, a portable memory 223, a LAN card 224 and a millimeter-wave transmitter-receiver 225. The portable memory 223 has DRAM 223a of about 5 gigabytes capable of storing about one piece of video data of about 2 hours for example. The LAN card 224 converts parallel to serial and sends video data received by the millimeter-wave transmitter-receiver 225 to the portable memory 223 side. The millimeter-wave transmitter-receiver 225 receives and outputs video data transmitted from the millimeter-wave transmitter-receiver 215 to the portable memory 223 through the LAN card 224, and receives and sends instruction information inputted by the input/output portion 221 from the control portion 222 to the server 210 side. The input/output portion 221 performs input and output of various kinds of information. The control portion 222 controls the respective portions described above.

Hereupon, the portable memory 223 can be inserted into and removed from the client 220, and the portable memory 223 which is inserted into the client 220 and has video data stored into it is used to reproduce the video data in the reproducing apparatus 230. That is, the reproducing apparatus 230 can have the portable memory 223 inserted into and removed from it, and in case of having the portable memory 223 inserted into it, the reproducing apparatus 230 reads, reproduces and outputs the video data in the portable memory 223.

Hereupon, the overall flow of a process is described. First, a user inserts the portable memory 223 into the client 220 and indicates video data desired to be downloaded by means of the input/output portion 221. This indication is transmitted from the millimeter-wave transmitter-receiver 225 through the control portion 222 to the server 210 side. In the server 210 side, the millimeter-wave transmitter-receiver 215 receives and then sends the indicated data from the client 220 side to the control portion 212. The control portion 212 instructs the large-capacity memory 213 to perform a process of transferring the indicated video data to the LAN card 214 side, and the large-capacity memory 213 transfers the indicated video data to the LAN card 214. The LAN card 214 converts the inputted video data from parallel to serial and sends them to the client 220 side through the millimeter-wave transmitter-receiver 215.

In the client 220 side, video data radio-transmitted from the millimeter-wave transmitter-receiver 215 are received by the millimeter-wave transmitter-receiver 225 and are stored into the portable memory 223 through the LAN card 224. After this, this portable memory 223 is removed from the client 220 and is inserted into the reproducing apparatus 230 and thereby the downloaded video data result in being reproduced.

Hereupon, the above-mentioned download system performs a high-speed and large-capacity transmission using the millimeter-wave transmitter-receivers 215 and 225, and particularly since the millimeter-wave transmitter-receiver 215 or 225 is connected directly to the large-capacity memory 213 having DRAM 213a enabling a high-speed access through the LAN card 214 or 224 or to the portable memory 223 having DRAM 223a, it is possible to perform a data transmission using millimeter waves without delay and perform download of video data utilizing a millimeter-wave transmission rate. As a result, even considering an effective transmission rate of millimeter-wave transmission, video data of about 2 hours can be downloaded to the portable memory 223 in a time of 1 minute or less. Further, since the DRAM 213 or 223a makes it possible to fundamentally form a memory out of one switch and one capacitor in its configuration, it is possible to make the physical size of a memory smaller and easily realize a large-capacity portable memory.

The millimeter-wave transmitter-receivers 215 and 225 each are made to be of a configuration having a transmitter-receiver but are not limited to this, and the server 210 side may be of a configuration having a millimeter-wave transmitter only and the client 220 side may be of a configuration having a millimeter-wave receiver only. In this case, it is enough that the indication of video data to be downloaded is performed from the input/output portion 211 of the server 210 side. Or the client 220 side may perform the indication to the server 210 side by means of another communication means.

And at least one of the millimeter-wave transmitter-receivers 215 and 225 may preferably perform transmission and reception using an NRD guide (Nonradiative Dielectric Wave Guide). The reason is that a transmitting and receiving circuit being small in loss can be formed by using an NRD guide. In this case, an oscillator may be shared by the transmission side and the reception side of a transmitter-receiver (see Japanese Patent Application No. 2003-049,954).

Particularly, by applying the NRD guide transceivers shown in embodiments 1 to 4 to the millimeter-wave transmitter-receivers 215 and 225, it is possible to realize a millimeter-wave transmitter-receiver being more small-sized and of a simple configuration.

Transmission and reception have been performed by radio using millimeter waves in a 60-GHz band by means of millimeter-wave transmitter-receivers 215 and 225 but is not limited to this and may be performed using an optical radio transmitting-receiving means or an optical fiber transmitting-receiving means. Due to this, a high-speed and large-capacity transmission is made possible.

As an application example of the above-mentioned embodiment 5, for example, video data can be reproduced in a train by disposing a server 210 and a client 220 in a kiosk in a station precinct, disposing a reproducing apparatus 230 in the train or the like, and by a fact that a user downloads its desired video data into its portable memory 223 and the user carries this downloaded portable memory 223. In this case, since the download time is very short, it is possible to sufficiently download video data in a waiting time for a train.

Further, in case of effectively utilizing a high-speed radio transmission using millimeter waves, it is possible to quickly download large-capacity video data when a train has come to a stop by disposing a server in each station precinct and a client 220 in the train. In this case also, a user can reproduce the downloaded video data using a reproducing apparatus 230 in the train.

And by standardizing this portable memory 223, it is possible to reproduce video data also by means of a general-purpose reproducing apparatus 230 held by a user.

Further, for example, by making drive-through a site where a server 210 and a client 220 are disposed, a user can download video data and the like in a short time in a state where the user is in a car. And in case that there is a reproducing apparatus 230 in the car, the user can watch the downloaded video data.

Particularly, such a download system is preferably installed in a location having the ability to attract customers, for example, a hotel lobby, a convenience store and the like as a location where it is disposed.

The portable memory 223 needs a power source for refreshing and the like due to using DRAM 223a but this power source can be realized by a primary battery or a secondary battery. Hereupon, video data may be deleted with the lapse of time by prescribing the capacity of a primary battery or a secondary battery. Due to this, in case that the download of video data is charged, it is possible to prevent video data from being very frequently utilized or being copied. The above-mentioned DRAM 213a; or 223a can be replaced with a memory having a similar function to this, namely, a small-sized and fast accessible memory.

And the above-mentioned embodiment has been described mentioning video data being dynamic image data of large capacity as an example but is not limited to this, and may deal with other data, for example, static image data, or data in which video data coexist. And the contents of data to be downloaded may be of various kinds and may be static images or video of a weekly magazine or a town information paper other than a movie.

Further, as an application example, this embodiment 5 can be also used in a video editing operation requiring rapidity. That is to say, by replacing a reproducing apparatus 230 with a video editing apparatus, for example it is possible to quickly download collected video into a portable memory 223 and edit the downloaded video by means of the editing apparatus in a TV station or the like.

EMBODIMENT 6

Next, embodiment 6 of this invention is described. In embodiment 5 described above, although a user downloads video data into a portable memory 223 in a client 220 and then inserts and directly connects the portable memory 223 having the video data stored in it to a reproducing apparatus 230, in this embodiment 2, video data downloaded into a portable memory is radio-transmitted to a reproducing apparatus side and then is reproduced there.

Figure 19:
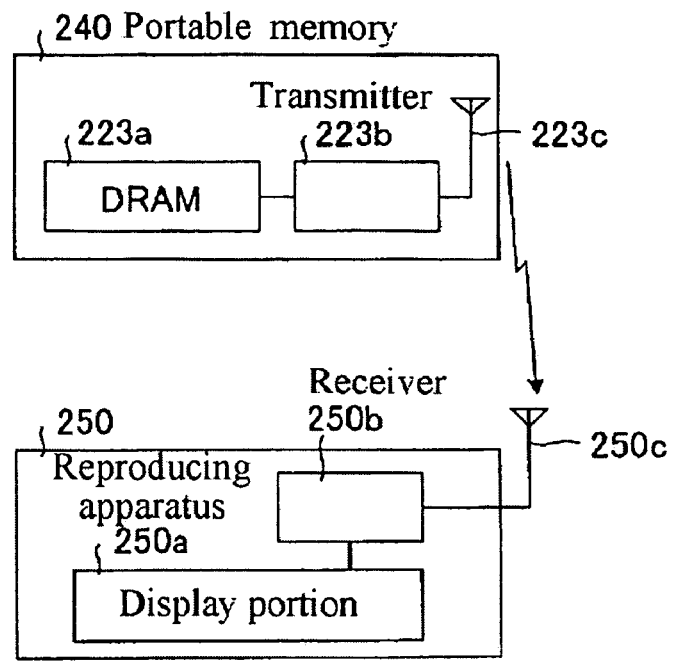
FIG. 19 is a block diagram showing a main part of a download system being embodiment 2 of this invention.
Figure 20:
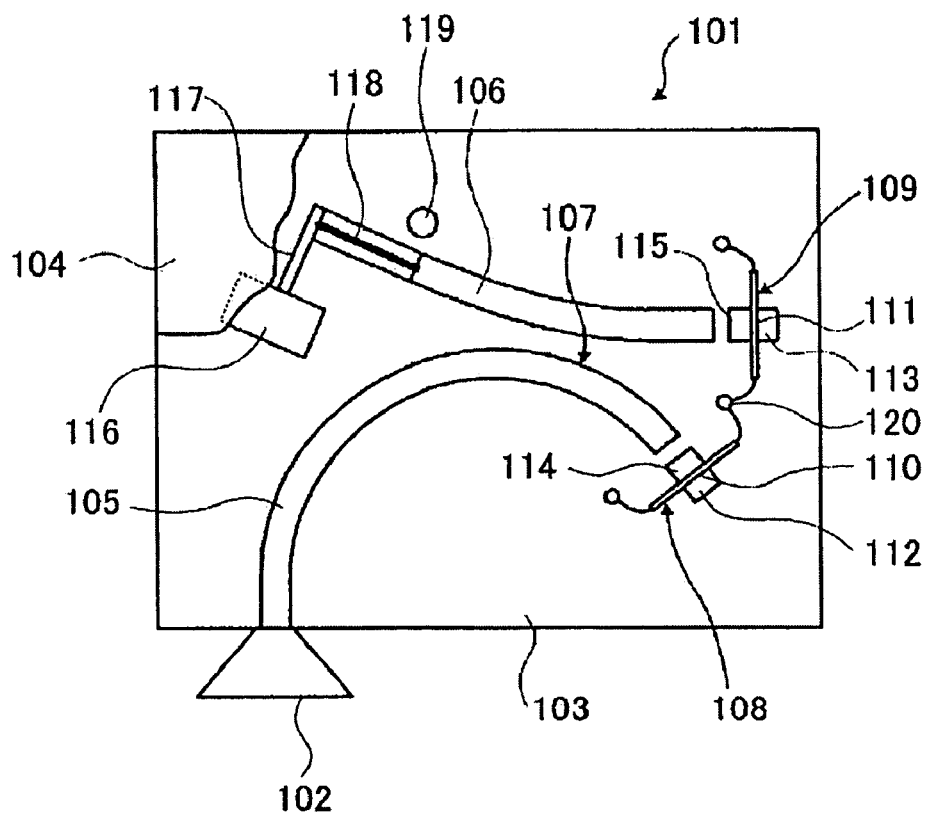
FIG. 20 is a plan view of a conventional NRD guide transceiver.
Figure 21:
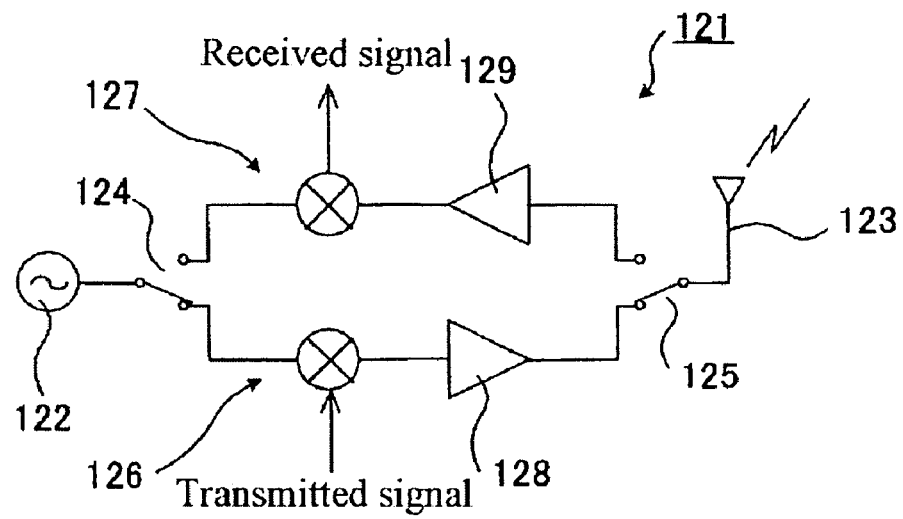
FIG. 21 is a conventional transmitting and receiving circuit diagram needing an amplifier.
Figure 22:
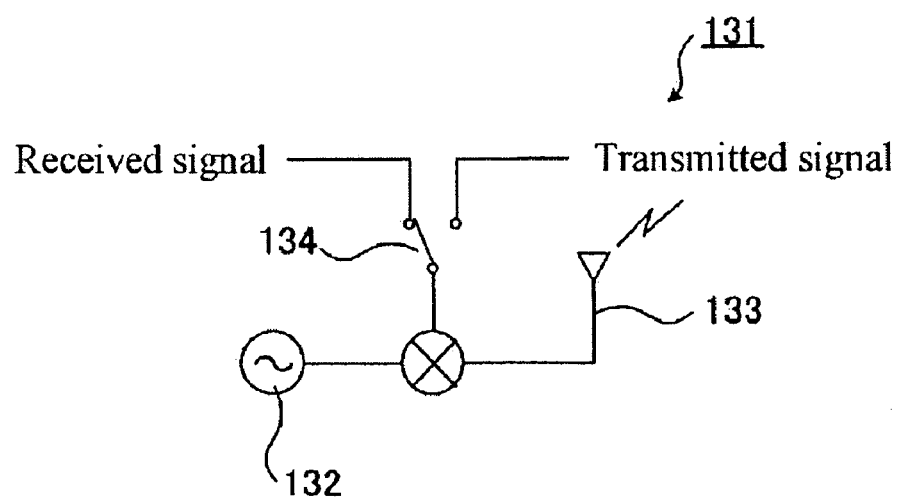
FIG. 22 is a conventional transmitting and receiving circuit diagram needing no amplifier.
Figure 23:
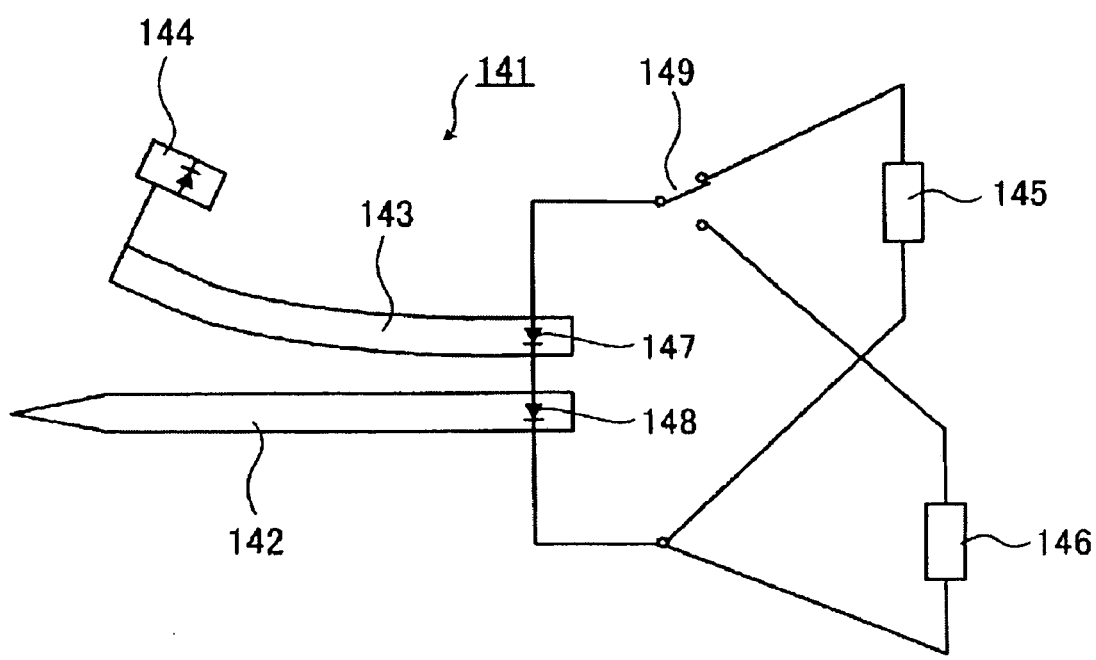
FIG. 23 is a conventional transmitting and receiving circuit using an NRD guide coupler.

FIG. 19 shows a main part configuration of a download system being embodiment 6 of this invention. A portable memory 240 corresponding to the portable memory 223 further has a transmitter 223b for performing a radio transmission of 2.4 GHz or 5.2 GHz and an antenna 223c. On the other hand, a reproducing apparatus 250 corresponding to the reproducing apparatus 230 has a display portion 250a for displaying video data, a receiver 250b for performing a radio reception of 2.4 GHz or 5.2 GHz and an antenna 250c. The other configuration is the same as embodiment 5.

In this embodiment 6, since the reproduction of video data stored in DRAM 223a of the portable memory 240 can be radio-connected, as a result a reproducing apparatus remotely placed can be utilized.

EMBODIMENT 7

Next, embodiment 7 of this invention is described. In this embodiment 7, video data to be downloaded has some adverting video data added to it and then is downloaded. Such adverting video data is stored in a region to store adverting video data in it provided in a large-capacity memory 13, and a control portion 212 adds adverting video data for each download. It is preferable to prepare some kinds of such adverting video data in advance and prevent the same advertising video data from being added to video data of the same user. Further, advertising video data is preferably added so as to be reproduced before video data specified by a user is reproduced. The reason is that these advertising video data are set so that the download fee of video data is made free or cheap by advertising charges. The addition of advertising video data may be selected by a user. And in case that advertising video data may be outputted even while downloaded video data specified by a user is being reproduced, the advertising video data may be downloaded so as to be overwritten onto some region of video of video data specified by the user.

INDUSTRIAL APPLICABILITY

As described above, the present invention is suitable for an NRD guide transceiver which is a key element for realizing a ultrahigh-speed and large-capacity wireless communication of a ultrahigh-speed radio LAN, a home link, a broadband radio access system, a vehicle-to-vehicle communication system and the like, a download system using this transceiver and a download memory used in this system.

The invention claimed is:

1. A download system, comprising;
   a server having:
   a server side transmitting and receiving means capable of performing transmission,
   a server side memory directly connected to said server side transmitting and receiving means and having DRAM or HDD for storing large-capacity data in said server side memory,
   a transmission side control means for making said server side transmitting and receiving means transmit requested data out of data stored in said server side memory according to a request from a client side, and
   a client having:
   a client side transmitting and receiving means for receiving data transmitted from said server side transmitting and receiving means,
   a download memory having DRAM or HDD into which large-capacity data received by said client side transmitting and receiving means are directly written and
   a reception side control means for indicating data to be downloaded to said server side and making the downloaded data be written into said download memory, in which
   said server side transmitting and receiving means and said client side transmitting and receiving means perform direct transmission and reception therebetween by means of a millimeter-wave transmission,
   at least one of said server side transmitting and receiving means is a circuit using an NRD guide (Non-radiative dielectric wave guide), and
   said circuit using an NRD guide (Non-radiative dielectric wave guide), comprises:
   a pair of dielectric strips disposed between a pair of conductor plates arranged in parallel with each other at a specified interval; an oscillator connected to one end of one of said pair of dielectric strips,
   an antenna connected to one end of the other of said pair of dielectric strips, and Schottky barrier diodes respectively connected to the other ends of both of said pair of dielectric strips.

2. The download system according to claim 1, wherein, said server further comprises a non-volatile memory means for storing large-capacity data stored in said server side memory in said server for backup.

3. The download system according to claim 1, further comprising:
   a reproducing apparatus being capable of having said download memory connected thereto and reproducing data stored in said download memory.

4. The download system according to claim 1, wherein, advertising data is added to said data to be downloaded.

5. The download system according to claim 1, wherein, said circuit using an NRD guide comprises:
   a low pass filter connected to a signal input terminal, and
   a high pass filter connected to an IF output terminal.

6. The download system according to claim 5, wherein, the mount of said Schottoky barrier diodes is formed in one body.

7. The download system according to claim 5, wherein, a bias circuit for applying a bias voltage to said Schottky barrier diodes is juxtaposed.

8. The download system according to claim 1, wherein, said download memory is constituted by a portable download memory capable of being directly connected to said client side transmitting and receiving means.

* * * * *